United States Patent [19]

Yokoya

[11] 4,439,696

[45] Mar. 27, 1984

[54] DIVIDING CIRCUIT

[75] Inventor: Satoshi Yokoya, Chofu, Japan

[73] Assignee: Sony Corporation, Tokyo, Japan

[21] Appl. No.: 363,551

[22] Filed: Mar. 30, 1982

[30] Foreign Application Priority Data

Apr. 6, 1981 [JP] Japan ................................ 56-51332

[51] Int. Cl.3 ........................ H03F 3/45; H03F 3/343; G06G 7/163

[52] U.S. Cl. .................................... 307/494; 330/261; 328/161

[58] Field of Search ................ 307/494, 490; 330/252, 330/261; 328/161

[56] References Cited

U.S. PATENT DOCUMENTS

| | | | |
|---|---|---|---|
| 3,401,350 | 9/1968 | Barton et al. | 330/261 |
| 3,643,107 | 2/1972 | Gilbreath | 307/494 |
| 3,843,935 | 10/1974 | Seki | 330/261 |
| 4,047,119 | 9/1977 | Ohmura et al. | 330/261 |
| 4,353,000 | 10/1982 | Noda | 328/161 |

*Primary Examiner*—John S. Heyman
*Attorney, Agent, or Firm*—Lewis H. Eslinger; Alvin Sinderbrand

[57] ABSTRACT

A dividing circuit for dividing a received AM stereo signal, which has been multiplied by a distortion correcting signal cos $\phi$, by the distortion correcting signal, including a first differential amplifier comprised of first and second transistors, the bases of the transistors being supplied with the received AM stereo signal, at least one transistor for supplying the distortion correcting signal to either the emitters or collectors of the first and second transistors, at least one diode connected between the collector of the first transistor and a reference voltage source and between the collector of the second transistor and the reference voltage source, a current source connected in parallel with each at least one diode for maintaining the emitter resistances of the transistors at a small constant value, and a second differential amplifier connected in cascade with the first differential amplifier for producing the divided output signal of the dividing circuit.

19 Claims, 4 Drawing Figures

DIVIDING CIRCUIT

BACKGROUND OF THE INVENTION

1. Field of the Invention

This invention relates generally to dividing circuits and, more particularly, is directed to a dividing circuit for use in an AM stereophonic broadcast system.

2. Description of the Prior Art

Systems for transmitting and receiving AM stereo signals are known in the art. In one such system, described in U.S. Pat. No. 4,218,586, an AM stereo broadcast system is disclosed which is compatible with both monaural and stereo receivers. In such system, a rectangular modulated signal is multiplied with a distortion correcting signal cos $\phi$, where $$\phi=\tan^{-1}L-R/l+L+R$$

Accordingly, a composite stereo broadcast signal is produced, as follows:

$$V(t)=\cos\phi\{(l+L+R)\cos\omega t+(L-R)\sin\omega t\}$$

This equation may be rewritten as follows:

$$V(t)=(l+L+R)\cos(\omega t+\phi)$$

This signal, which has been non-linearly modified by the distortion correcting signal cos $\phi$, is then transmitted and is compatible with both a monophonic receiver and a stereo receiver. When the transmitted signal is received by a monophonic receiver, it is demodulated by an envelope detector and an output signal proportional to (L+R) is produced. When the transmitted signal is received by a stereo receiver, in order to prevent distortion upon demodulation of the signal, the distortion correcting signal cos $\phi$ is detected and the received stereo signal V(t) is divided by the distortion correcting signal cos $\phi$ to produce the original rectangular modulated signal. In this regard, it is to be appreciated that the AM stereo receiver requires a dividing circuit for cancelling or eliminating the aforesaid distortion correcting signal cos $\phi$.

The dividing circuit is generally constructed of a differential amplifier comprised of two transistors, one of the transistors being supplied with the stereo signal V(t) at its base, with the bases of the two transistors being connected to each other by two oppositely-poled series-connected diodes. A signal corresponding to the distortion correcting signal is supplied to the connection point between the oppositely-poled diodes. In this manner, the original stereo output signal is produced at the collectors of the two transistors.

In order to prevent distortion in the stereo output signal from becoming large, the value of the resistances provided at the bases of the two transistors of the dividing circuit are set much greater than the operating resistances of the diodes. However, in the case where the dividing circuit is operated in its full dynamic range such that the current flowing through the diodes is cut off, that is, at the limits of the dynamic range thereof, the operating resistances of the diodes become large and the aforementioned condition of the input base resistances being much greater than the operating resistances of the diodes is not satisfied. As a result, distortion in the output stereo signal becomes great. It should therefore be appreciated that such dividing circuit cannot be used with a wide dynamic range.

Further, because of the condition that the input resistances at the bases of the transistors are much greater than the operating resistances of the diodes, a large in-phase mode signal of the current flowing through the diodes results. In such case, if the balance between the characteristics of the transistors, the diodes and the input base resistances to the transistors is poor, the signal corresponding to the distortion correcting signal, which is supplied to the dividing circuit, is undesirably mixed with the output stereo signal from the differential amplifier which, in turn, results in further distortion.

OBJECTS AND SUMMARY OF THE INVENTION

Accordingly, it is an object of this invention to provide a dividing circuit that overcomes the aforementioned difficulties encountered in the prior art.

In particular, it is an object of this invention to provide a dividing circuit having a large dynamic range which produces little distortion in the output signal therefrom.

It is another object of this invention to provide a dividing circuit in which a distortion correcting signal that functions as a divisor signal is not mixed with the output signal from the dividing circuit even if various circuit characteristics are unbalanced.

It is still another object of this invention to provide a dividing circuit which can operate at a low voltage.

In accordance with an aspect of this invention, a dividing circuit for producing a divided output signal in response to first and second input signals, includes first differential amplifier means supplied with the first and second input signals and having an output for producing an output quotient signal corresponding to the division of the first input signal by the second input signal; non-linear load means connected to the output of the first differential amplifier means; and second differential amplifier means connected in cascade to the first differential amplifier means for producing the divided output signal in response to the output quotient signal.

In accordance with another aspect of this invention, a dividing circuit for producing a divided output signal in response to first and second input signals, includes differential amplifier means supplied with the first and second input signals for producing the divided output signal corresponding to the division of the first input signal by the second input signal, the differential amplifier means including at least one emitter resistance; and means for maintaining the value of the at least one emitter resistance substantially at a predetermined value throughout the entire dynamic operating range of the dividing circuit.

The above, and other, objects, features and advantages of the present invention will become apparent from the following detailed description of illustrative embodiments of the invention which is to be read in connection with the accompanying drawings.

DETAILED DESCRIPTION OF THE PREFERRED EMBODIMENTS

Figure 1:
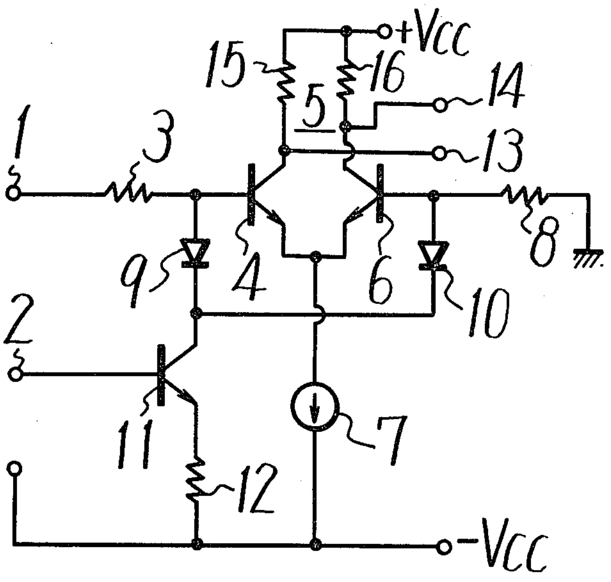
FIG. 1 (PRIOR ART)
FIG. 1 is a circuit-wiring diagram of a dividing circuit according to the prior art.

Referring to the drawings in detail, and initially to FIG. 1 thereof, a dividing circuit according to the prior art, which is similar to that shown in U.S. Pat. No. 4,218,586, includes a first input terminal 1 supplied with an intermediate frequency component of the transmitted stereo signal V(t) from an intermediate frequency stage (not shown), which signal V(t) has been multiplied by the distortion correcting signal cos $\phi$ and which constitutes the dividend signal for the dividing circuit. A second input signal corresponding to the distortion correcting signal cos $\phi$ constitutes the divisor signal for the dividing circuit and is supplied to a second input terminal 2 thereof. This latter signal may be obtained by removing the amplitude component from the input stereo signal V(t) to produce a cos $(\omega t+\phi)$ signal, forming a cos $\omega t$ signal from the cos $(\omega t+\phi)$ signal by means of a phase-locked loop (PLL), multiplying the cos $(\omega t+\phi)$ signal with the cos $\omega t$ signal, and thereafter removing high frequency components therefrom to produce the divisor signal, as described more fully in U.S. Pat. No. 4,218,586.

The stereo signal V(t) from input terminal 1 is supplied through a capacitor (not shown) and a resistor 3 to the base of an NPN transistor 4 which, along with a second NPN transistor 6, forms a differential amplifier 5. In particular, the emitter of transistors 4 and 6 are commonly connected through a current supply source 7 to a negative voltage supply source $-V_{cc}$. The base of transistor 6 is grounded through a resistor 8. In addition, the bases of transistors 4 and 6 are coupled together through oppositely-poled series-connected diodes 9 and 10 such that the cathodes of diodes 9 and 10 are connected together. An NPN transistor 11 has its base supplied with the second input signal from input terminal 2, its emitter connected to the negative voltage supply source $-V_{cc}$ through a resistor 12, and its collector connected to the connection point between diodes 9 and 10. The output quotient or divided signal is produced as a differential output signal at output terminals 13 and 14 connected to the collectors of transistors 4 and 6, respectively, of differential amplifier 5. The collectors of transistors 4 and 6 are also connected to a positive voltage supply source $+V_{cc}$ through resistors 15 and 16, respectively.

In operation, if the first input or stereo voltage signal supplied to input terminal 1 is given as $V_i$, the voltage produced between the bases of transistors 4 and 6 is given as $V_b$, the combined value of the resistances of resistors 3 and 8 is given as R and the combined operating resistance of diodes 9 and 10 is given as rd, the following relationship can be obtained:

$$V_b=2\mathrm{rd}/2(R+rd).V_i \quad (1).$$

If the combined current through diodes 9 and 10 is given as id, the combined operating resistance rd of diodes 9 and 10 can be expressed as follows:

$$rd=kT/q\cdot 1/id\approx 0.026/id \quad (2),$$

where kT/q is Boltzmann's constant.

In order to substantially reduce distortion in the output quotient or differential signal, the combined operating resistance rd of diodes 9 and 10 is selected much smaller than the combined resistance R of resistors 3 and 8. Thus, if transistor 11 is controlled by the input signal supplied thereto from second input terminal 2 such that the current id flowing through diodes 9 and 10 causes the condition R>rd to be satisfied, equation (1) can be rewritten as follows:

$$V_b=rd/R\cdot V_i \quad (3).$$

If equation (2) is substituted into equation (3), the following equation can be obtained:

$$V_b=0.026/R\cdot 1/id\cdot V_i \quad (4).$$

From equation (4), it should be understood that the voltage $V_b$ between the bases of transistors 4 and 6 is proportional to the first input or stereo signal $V_i$ and is inversely proportional to the current id flowing through diodes 9 and 10. Accordingly, when the current id flowing through diodes 9 and 10 is controlled to be proportional to the second input or divisor signal supplied to input terminal 2, the differential output signal from differential amplifier 5 at output terminals 13 and 14 thereof corresponds to the division of the input stereo signal $V_i$ supplied to input terminal 1 divided by the divisor signal supplied to input terminal 2.

With the dividing circuit described above, if differential amplifier 5 is used up to its full dynamic range, the current id that flows through diodes 9 and 10 is equal to the current necessary to cut off diodes 9 and 10. In such case, however, the combined operating resistance rd of diodes 9 and 10 becomes sufficiently large such that the aforementioned condition R>rd is not satisfied, thereby resulting in a large distortion in the output differential or quotient signal from differential amplifier 5. It should therefore be appreciated that differential amplifier 5, and therefore the dividing circuit of FIG. 1, cannot be used with a sufficiently wide dynamic range.

In addition, because the combined operating resistance rd of diodes 9 and 10 is selected to be much lower than resistance R of resistors 3 and 8, as aforementioned, a large in-phase mode signal of the current id flowing through diodes 9 and 10 is supplied to the bases of transistors 4 and 6. The level of this in-phase mode signal, which corresponds to the divisor or second input signal supplied to input terminal 2, is larger than that of the stereo input signal supplied through resistors 3 and 8. Accordingly, if the balance between transistors 4 and 6, diodes 9 and 10 and transistors 3 and 8 is poor, the second input signal supplied to input terminal 2, that is, the divisor or cos $\phi$ signal, is mixed with the differential output or quotient signal from differential amplifier 5, resulting in further distortion thereof.

Figure 2:
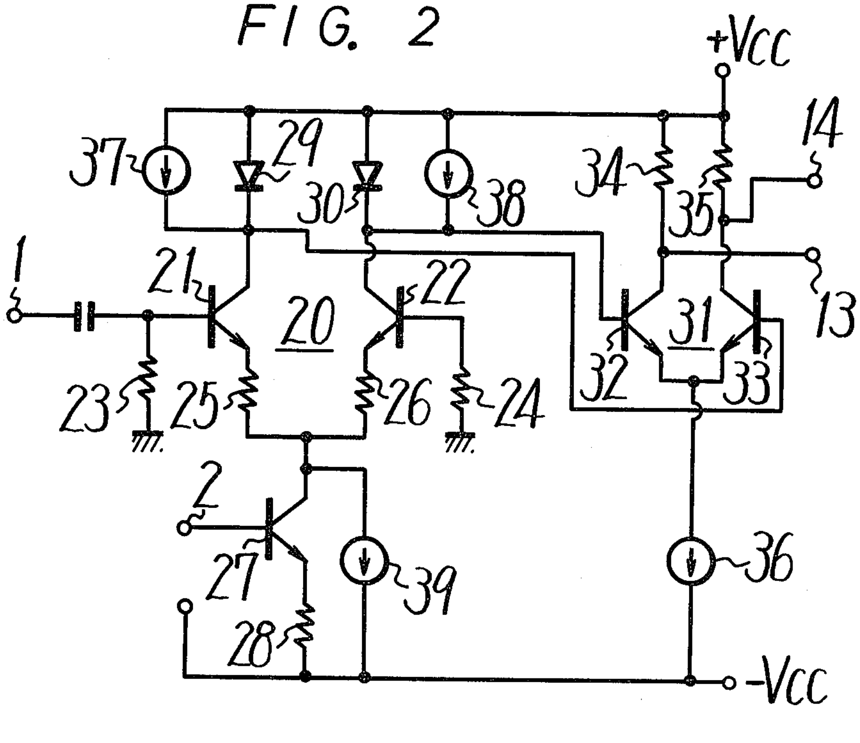
FIG. 2 is a circuit-wiring diagram of a dividing circuit according to one embodiment of this invention.

Referring now to FIG. 2, it will be seen that, in a dividing circuit according to one embodiment of this invention, elements corresponding to those described above with reference to the prior art dividing circuit of FIG. 1 are identified by the same reference numerals and a detailed description thereof will be omitted for the sake of brevity. In the dividing circuit according to the first embodiment of this invention, the first input or stereo signal $V_i$ is supplied from an input terminal 1 through a capacitor to the base of an NPN transistor 21 which, along with an NPN transistor 22, forms a first differential amplifier 20. In particular, the bases of transistors 21 and 22 are each grounded through resistors 23 and 24, respectively, and the emitters thereof are connected to each other through emitter resistors 25 and 26, respectively. The connection point between resistors 25 and 26 is connected to a negative voltage supply source $-V_{cc}$ through the collector-emitter path of an NPN transistor and an emitter resistor 28 thereof, the base of transistor 27 being connected to second input terminal 2 which is supplied with the divisor or cos $\phi$ signal. In addition, a current source 39, the purpose of which will be apparent from the discussion hereinafter, is connected between negative voltage supply source $-V_{cc}$ and the collector of transistor 27. The collectors of transistors 21 and 22 are connected to a positive voltage supply source $+V_{cc}$ through diodes 29 and 30, respectively, which have their cathodes connected to the respective collectors and their anodes connected to positive voltage supply source $+V_{cc}$, and which constitute load circuits for transistors 21 and 22, respectively. As will be described in greater detail hereinafter, constant current sources 37 and 38 are coupled in parallel with diodes 29 and 30, respectively, to maintain the values of the emitter resistances of transistors 21 and 22 at a small constant value so as to prevent an increase in distortion of the output signal from first differential amplifier 20. The currents flowing through constant current sources 37 and 38 are adapted to be absorbed by constant current source 39.

The collectors of transistors 21 and 22 which constitute the output of first differential amplifier 20 are connected to the bases of two NPN transistors 32 and 33, respectively, which form a second differential amplifier 31. In other words, second differential amplifier 31 is connected in cascade with first differential amplifier 20. The emitters of transistors 32 and 33 are commonly connected to negative voltage supply source $-V_{cc}$ through a constant current source 36. The collectors of transistors 32 and 33 are connected to output terminals 13 and 14, respectively, of the dividing circuit and are also connected to positive voltage supply source $+V_{cc}$ through resistors 34 and 35, respectively.

In operation, when first input signal $V_i$ is supplied from input terminal 1 to the base of transistor 21, this latter transistor is turned ON, whereby a collector current $I_c$ is caused to flow therethrough and may be expressed as follows:

$$I_c = V_i/re + R_1 \quad (5),$$

where re is the emitter resistance of transistor 21, and $R_1$ is the value of the resistance of resistor 25. Accordingly, the differential output voltage $V_0$ from first differential amplifier 20 between the collectors of transistors 21 and 22 can be expressed as follows:

$$V_0 = I_c \cdot rd_1 \quad (6),$$

where $rd_1$ is the operating resistance of diode 29. If equation (5) is substituted into equation (6), the following new equation is obtained:

$$V_0 = V_i/re + R_1 \cdot rd_1 \quad (7).$$

Since the operating resistance $rd_1$ of diode 29 is equal to $0.0026/id_1$, in accordance with equation (2), equation (7) can be rewritten as follows:

$$V_0 = V_i/re + R_1 \cdot 0.026/id_1 \quad (8),$$

where $id_1$ is the current flowing through diode 29, and therefore, also through first differential amplifier 20. In this regard, if the current flowing from transistor 27 is controlled so as to be increased proportionally to the level of the second input signal supplied from input terminal 2, the current $id_1$ flowing through first differential amplifier 20 is likewise controlled so that the differential output signal from first differential amplifier 20, which is inversely proportional to the bias current from transistor 27, corresponds to the division of the first input signal $V_i$ supplied to input terminal 1 divided by the second input signal supplied to second input terminal 2. This differential output signal is then supplied to second differential amplifier 31 and an output quotient signal or second differential output signal is produced at output terminals 13 and 14.

It is to be appreciated that the dividing circuit of FIG. 2 provides distinct advantages over the prior art dividing circuit of FIG. 1. In particular, with the dividing circuit of FIG. 1, the in-phase mode signal of the current id flowing through diodes 9 and 10, which corresponds to the input signal supplied to input terminal 2, is produced with its level much larger than the stereo input signal from input terminal 1 supplied to resistors 3 and 8. As a result, the input signal from input terminal 2 is mixed with the differential output signal from differential amplifier 5 at output terminals 13 and 14. In accordance with the present invention, the stereo input signal supplied to input terminal 1 and the in-phase mode signal are produced with substantially the same level at diodes 29 and 30 so that the latter in-phase mode signal is cancelled. In this manner, a signal corresponding to the input signal supplied to second input terminal 2 is not mixed with the differential output signal from second differential amplifier 31.

It is also desirable to use first differential amplifier 20 of the dividing circuit of FIG. 2 in its full dynamic range, that is, until the currents flowing through diodes 29 and 30 are cut off. A similar problem to that previously posed in regard to the dividing circuit of FIG. 1 may result when the dividing circuit of FIG. 2 is used with a wide dynamic range, that is, where the operating resistances of diodes 9 and 10 become undesirably large in the dividing circuit of FIG. 1. In the dividing circuit of FIG. 2, the similar problem that may result is that the emitter resistances re of transistors 21 and 22 may become large when the dividing circuit is used with a wide dynamic range to thereby increase distortion in the output signal from the dividing circuit. In accordance with the present invention, however, since the currents flowing through diodes 29 and 30 are bypassed by the currents from current supply sources 37 and 38, respectively, which are connected in parallel therewith, the emitter resistances re of transistors 21 and 22 are always maintained at a constant small value. In this manner, distortion in the output signal will not increase so that second differential amplifier 31 can be used, without distortion, up to, for example, 70%–80% of the dynamic range of transistors 32 and 33 thereof.

In addition, as a result of the non-linearity of diodes 29 and 30, the differential output signal from first differential amplifier 20 may be adversely affected. However, such adverse affect is cancelled by the base-emitter paths of transistors 32 and 33, which are directly connected to the output of first differential amplifier 20.

Figure 3:
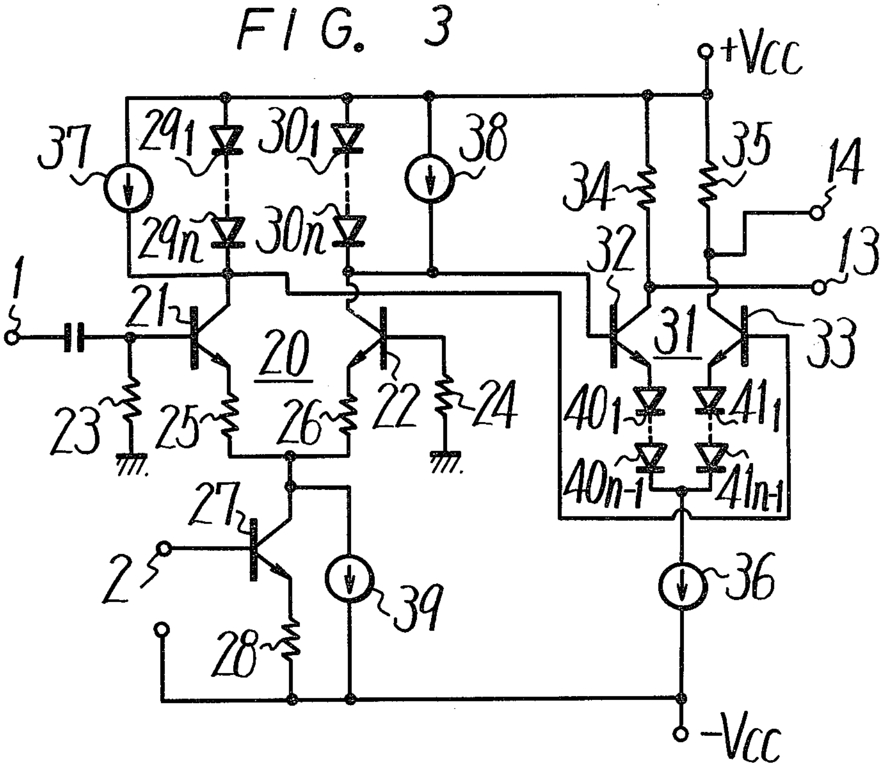
FIG. 3 is a circuit-wiring diagram of a dividing circuit according to another embodiment of this invention.

Referring now to FIG. 3, it will be seen that, in a dividing circuit according to another embodiment of this invention, elements corresponding to those described above with reference to the dividing circuit of FIG. 2 are identified by the same reference numerals and a detailed description thereof will be omitted for the sake of brevity. In the dividing circuit of FIG. 3, diode 29 is replaced by a plurality of series-connected diodes $29_1$, $29_2$ . . . $29_n$, and diode 30 is replaced by plurality of series-connected diodes $30_1$, and $30_2$ . . . $30_n$. In addition, a plurality of series-connected diodes $40_1$, $40_2$ . . . $40_{n-1}$ and a plurality of series-connected diodes $41_1$, $41_2$ . . . $41_{n-1}$ are connected in the emitter legs of transistors 32 and 33, respectively, that is, between the respective emitters thereof and current source 36.

With the dividing circuit of FIG. 3, in addition to the aforementioned advantages previously described in regard to the dividing circuit of FIG. 2, the cut-off voltage of the dividing circuit can be raised as a result of the plurality of series-connected diodes $29_1$, $29_2$ . . . $29_n$ and the plurality of series-connected diodes $30_1$, $30_2$ . . . $30_n$, whereby a larger differential output signal can be achieved to thereby improve the signal-to-noise (S/N) ratio. In such case, the plurality of series-connected diodes $40_1$, $40_2$ . . . $40_{n-1}$ and the plurality of series-connected diodes $41_1$, $41_2$ . . . $41_{n-1}$, each of which series includes one less diode than the series-connected diodes connected to the collectors of transistors 21 and 22, are provided to eliminate distortion due to the non-linear characteristic of the latter diodes.

Figure 4:
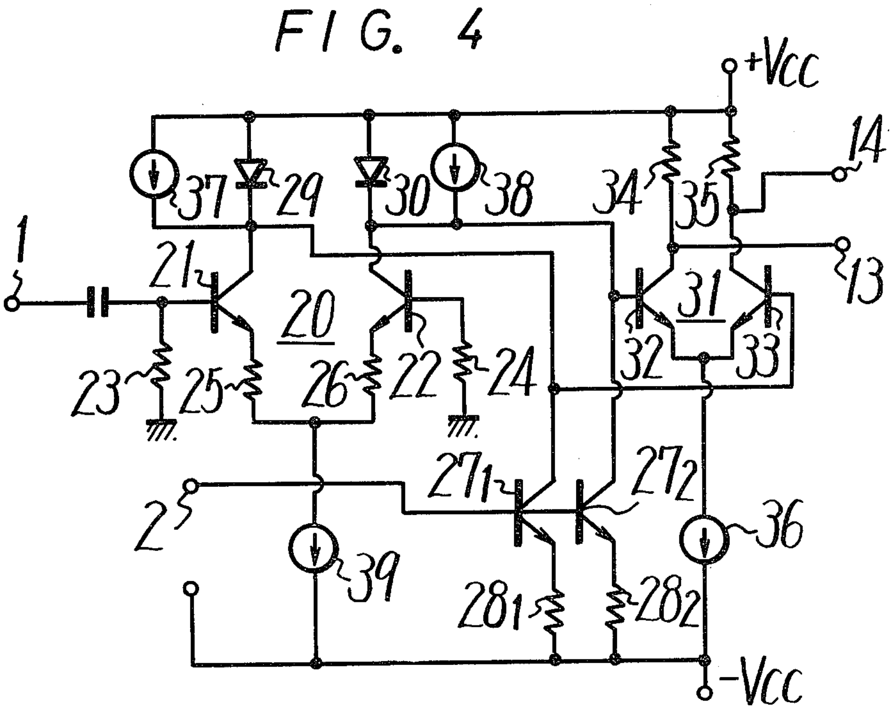
FIG. 4 is a circuit-wiring diagram of a dividing circuit according to still another embodiment of this invention.

Referring now to FIG. 4, it will be seen that, in a dividing circuit according to another embodiment of this invention, elements corresponding to those described above with reference to the dividing circuit of FIG. 2 are identified by the same reference numerals and a detailed description thereof will be omitted for the sake of brevity. In this embodiment of the invention, the signal corresponding to the second input signal is supplied to the collectors of transistors 21 and 22 rather than the emitters thereof. In particular, transistor 27 is replaced by two NPN transistors $27_1$ and $27_2$ for performing the voltage-current conversion of the second input signal supplied from second input terminal 2. Thus, the second input signal from second input terminal 2 is supplied to the commonly connected bases of transistors $27_1$ and $27_2$. The collector of transistor $27_1$ is connected to the common connection point of the collector of transistor 21 and the base of transistor 33, and the collector of transistor $27_2$ is connected to the common connection point of the collector of transistor 22 and the base of transistor 32. The emitters of transistors $27_1$ and $27_2$ are connected to the negative voltage supply source $-V_{cc}$ through resistors $28_1$ and $28_2$, respectively. In addition, the emitters of transistors 21 and 22 are connected to the negative voltage supply source $-V_{cc}$ through resistors 25 and 26, respectively, and through current source 39.

In addition to the advantages previously discussed in regard to the dividing circuit of FIG. 2, the dividing circuit of FIG. 4 provides further distinct advantages over the prior art. In particular, since the voltage-to-current conversion of the second input signal is carried out apart from first differential amplifier 20 to which the first stereo input signal is applied, the dividing circuit can be operated at a lower voltage.

It is to be appreciated that the dividing circuit according to the above embodiments of this invention provide distinct advantages over the prior art dividing circuit of FIG. 1. In particular, with the dividing circuit of FIG. 1, the first input or stereo signal is supplied from input terminal 1 through resistors 3 and 8, and the second input or divisor signal supplied from second input terminal 2 to transistor 11 results in changes in the current flowing through diodes 9 and 10 to thereby provide division of the first input signal by the second input signal. With the prior art circuit of FIG. 1, however, it is possible that the second input or divisor signal will be mixed with the differential output signal from differential amplifier 5. The dividing circuit according to the present invention overcomes this disadvantage and substantially reduces or prevents the divisor signal from being mixed with the differential output signal from differential amplifier 20, even if the circuit elements therein are unbalanced with respect to each other. Further, in accordance with the present invention, since constant current sources 37 and 38 supply currents which bypass diodes 29 and 30, the emitter resistances of transistors 25 and 26, which comprise the first differential amplifier 20, are maintained at a constant small value. This means that distortion in the output signal of the dividing circuit will not be increased even when the first differential amplifier is used in its full dynamic range. In this manner, the dynamic range of the dividing circuit can be enlarged to thereby improve the S/N ratio and other characteristics of the circuit. In addition, in the dividing circuit of FIG. 4, the application of the divisor signal directly to the collectors of transistors 21 and 22 of first differential amplifier 20 provides that the dividing circuit can operate at a low voltage.

It should be appreciated that, although the above dividing circuit according to this invention has been described for use in a demodulating circuit for an AM stereo system, such as that described in the aforementioned U.S. Pat. No. 4,218,586, the dividing circuit is not limited to such system. For example, the dividing circuit according to the present invention may be applied to stereo demodulating circuits of other systems, such as that described in U.S. Pat. No. 3,944,749. In addition, other modifications can be made to the present invention. For example, although diodes have been used as load resistances for first differential amplifier 20, it is to be appreciated that other semiconductor load resistances may be used for achieving the same result.

Having described specific preferred embodiments of this invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A dividing circuit for producing a divided output signal in response to first and second input signals, comprising:

first differential amplifier means supplied with said first and second input signals and having an output for producing an output quotient signal corresponding to the division of said first input signal by said second input signal;

non-linear load means connected to the output of said first differential amplifier means; and second differential amplifier means connected in cascade to said first differential amplifier means and having an input supplied with said output quotient signal for providing a compensating effect for the non-linear load means of said first differential amplifier means.

2. A dividing circuit for producing a divided output signal in response to first and second input signals, comprising:

first differential amplifier means supplied with said first and second input signals and having an output for producing an output quotient signal corresponding to the division of said first input signal by said second input signal, said first differential amplifier means including first and second transistors, each having an input, an output and a third electrode, the first input signal being supplied to the input electrode of said first transistor and the second input signal being supplied to one of the output and third electrodes of said first and second transistors;

non-linear load means connected to the output of said first differential amplifier means; and second differential means connected in cascade to said first differential amplifier means for providing a compensating effect for the non-linear load means of said first differential amplifier means.

3. A dividing circuit according to claim 2; in which said second differential amplifier means includes third and fourth transistors, each having an input, an output and a third electrode, the output electrodes of said first and second transistor being connected to the input electrodes of said third and fourth transistors, and the divided output signal being produced at the output electrodes of said third and fourth transistors.

4. A dividing circuit according to claim 2; in which said non-linear load means includes PN junction means connected between the output electrodes of said first and second transistors and a reference potential.

5. A dividing circuit according to claim 4; in which said PN junction means includes a first PN junction element connected between the output electrode of said first transistor and said reference potential, and a second PN junction element connected between the output electrode of said second transistor and said reference potential.

6. A dividing circuit according to claim 5; in which said first and second PN junction elements each include a diode.

7. A dividing circuit according to claim 4; in which said PN junction means includes a plurality of series-connected PN junction elements connected between the output electrodes of said first and second transistors and said reference potential.

8. A dividing circuit according to claim 7; in which each PN junction element of said plurality of series-connected PN junction elements includes a diode.

9. A dividing circuit according to claim 7; in which said second differential amplifier means includes third and fourth transistors, each having an electrode connected to a second reference potential, and further including a plurality of series-connected PN junction elements connected between the electrodes of said third and fourth transistors and said second reference potential.

10. A dividing circuit according to claim 9; in which the number of said plurality of series-connected PN junction elements connected between the electrodes of said third and fourth transistors and said second reference potential is one less than the number of said plurality of series-connected PN junction elements connected between the output electrodes of said first and second transistors and said first-mentioned reference potential.

11. A dividing circuit according to claim 2; further including means for supplying said second input signal to the third electrodes of said first and second transistors.

12. A dividing circuit according to claim 11; in which said means for supplying includes a transistor having an output path connected between the third electrodes of said first and second transistors and a reference potential, and an input electrode supplied with said second input signal.

13. A dividing circuit according to claim 2; further including means for supplying said second input signal to the output electrodes of said first and second transistors.

14. A dividing circuit according to claim 13; in which said means for supplying includes transistor means having input means supplied with said second input signal and output path means connected to the output electrodes of said first and second transistors and to said second differential amplifier means.

15. A dividing circuit according to claim 2; in which said third electrodes each have a resistance; and further including means for maintaining the value of the resistance of at least one of said electrodes substantially at a predetermined value throughout the entire dynamic range of said dividing circuit.

16. A dividing circuit according to claim 15; in which said means for maintaining includes constant current source means connected in parallel with said non-linear load means.

17. A dividing circuit of a dynamic range suitable for producing a divided output signal in response to first and second wide audio range input signals, comprising:

differential amplifier means supplied with said first and second input signals for producing said divided output signal corresponding to the division of said first input signal by said second input signal, said differential amplifier means including first and second transistors, each having an input, an output and an emitter, each emitter having an emitter resistance; and means for maintaining the value of said emitter resistances substantially at a predetermined value throughout the entire dynamic range of said dividing circuit.

18. A dividing circuit according to claim 17; in which said differential amplifier means includes output electrode means, and further including non-linear load means connected to said output electrode means, and said means for maintaining includes constant current source means connected in parallel with said non-linear load means.

19. A dividing circuit according to claim 18; in which said non-linear load means includes at least one PN junction element connected between said output electrode means and a reference potential.

* * * * *